United States Patent
Fedan

(10) Patent No.: US 10,367,457 B2
(45) Date of Patent: Jul. 30, 2019

(54) SINGLE STAGE RAMPED POWER AMPLIFIERS

(71) Applicant: CalAmp Wireless Networks Corporation, Irvine, CA (US)

(72) Inventor: Orest Fedan, Irvine, CA (US)

(73) Assignee: CalAmp Wireless Networks Corporation, Irvine, CA (US)

( * ) Notice: Subject to any disclaimer, the term of this patent is extended or adjusted under 35 U.S.C. 154(b) by 0 days.

(21) Appl. No.: 15/726,187

(22) Filed: Oct. 5, 2017

(65) Prior Publication Data

US 2019/0013783 A1 Jan. 10, 2019

Related U.S. Application Data

(60) Provisional application No. 62/529,294, filed on Jul. 6, 2017.

(51) Int. Cl.
*H03F 3/217* (2006.01)
*H03F 3/20* (2006.01)
(Continued)

(52) U.S. Cl.
CPC .............. *H03F 3/20* (2013.01); *H03F 3/19* (2013.01); *H03F 3/245* (2013.01); *H03F 2200/451* (2013.01)

(58) Field of Classification Search
CPC . H03F 3/20; H03F 1/223; H03F 3/193; H03F 3/45179; H03F 1/3211; H03F 1/42; H03F 1/523; H03F 2200/102; H03F 2200/108; H03F 2200/294; H03F 2200/451; H03F 2200/489; H03F 2200/492; H03F 2200/72
(Continued)

(56) References Cited

U.S. PATENT DOCUMENTS

| 4,177,466 A | 12/1979 | Reagan |
| 4,818,988 A | 4/1989 | Cooperman et al. |

(Continued)

FOREIGN PATENT DOCUMENTS

| EP | 1885058 A1 | 2/2008 |
| WO | 1991012671 | 8/1991 |
| WO | 2011049619 A1 | 4/2011 |

OTHER PUBLICATIONS

Written Opinion of the International Searching Authority for PCT Application No. PCT/US10/02789 dated Dec. 29, 2010 (9 pages).

*Primary Examiner* — Khanh V Nguyen
(74) *Attorney, Agent, or Firm* — KPPB LLP

(57) ABSTRACT

Single stage ramped power amplifiers in accordance with embodiments of the invention are disclosed. In one embodiment, a single stage ramped power amplifier includes a RF transceiver, a ramp voltage, a power supply, and an output circuit, wherein the ramp voltage is coupled to a resistor that is coupled to a first inductor, the power supply is coupled to a second inductor, the RF transceiver is coupled to the second inductor and a first capacitor, the first capacitor is coupled to a PIN diode, the PIN diode is coupled to the first inductor and a second capacitor, the second capacitor is coupled to a first transistor, the first transistor is coupled to a third capacitor, the third capacitor is coupled to a third inductor, the third inductor is coupled to a second transistor, and the second transistor is coupled to the output circuit.

16 Claims, 8 Drawing Sheets

(51) Int. Cl.
*H03F 3/19* (2006.01)
*H03F 3/24* (2006.01)

(58) Field of Classification Search
USPC .................. 330/51, 251, 277, 300, 302, 310
See application file for complete search history.

(56) References Cited

U.S. PATENT DOCUMENTS

| | | | |
|---|---|---|---|
| 4,818,998 A | 4/1989 | Apsell et al. | |
| 4,908,609 A | 3/1990 | Stroomer | |
| 5,032,845 A | 7/1991 | Velasco | |
| 5,109,538 A | 4/1992 | Ikonen et al. | |
| 5,343,498 A | 8/1994 | Toy et al. | |
| 5,392,287 A | 2/1995 | Tiedemann et al. | |
| 5,438,684 A | 8/1995 | Osamni et al. | |
| 5,526,357 A | 6/1996 | Jandress | |
| 5,704,008 A | 12/1997 | Duvall, Jr. | |
| 5,732,339 A | 3/1998 | Auvray et al. | |
| 5,789,098 A | 8/1998 | Pinder | |
| 5,917,423 A | 6/1999 | Duvall | |
| 5,939,941 A * | 8/1999 | Nair | H01L 27/0605 257/E27.012 |
| 5,940,431 A | 8/1999 | Haartsen et al. | |
| 6,058,289 A | 5/2000 | Gardner et al. | |
| 6,198,919 B1 | 3/2001 | Buytaert et al. | |
| 6,229,988 B1 | 5/2001 | Stapefeld et al. | |
| 6,289,227 B1 | 9/2001 | Shi | |
| 6,317,049 B1 | 11/2001 | Toubia et al. | |
| 6,363,102 B1 | 3/2002 | Ling et al. | |
| 6,522,698 B1 | 2/2003 | Irving et al. | |
| 6,535,116 B1 | 3/2003 | Zhou et al. | |
| 6,564,074 B2 | 5/2003 | Romans | |
| 6,603,335 B1 | 8/2003 | MacPhail et al. | |
| 6,647,270 B1 | 11/2003 | Himmelstein | |
| 6,665,613 B2 | 12/2003 | Duvall | |
| 6,774,845 B2 | 8/2004 | De | |
| 6,799,030 B2 | 9/2004 | Barber | |
| 6,888,495 B2 | 5/2005 | Flick | |
| 6,978,149 B1 | 12/2005 | Morelli et al. | |
| 7,030,731 B2 | 4/2006 | Lastinger | |
| 7,034,656 B2 | 4/2006 | Buchner | |
| 7,149,484 B2 | 12/2006 | Nation | |
| 7,149,623 B2 | 12/2006 | Flick et al. | |
| 7,269,145 B2 | 9/2007 | Koo | |
| 7,378,964 B1 | 5/2008 | Amir et al. | |
| 7,511,606 B2 | 3/2009 | Romano et al. | |
| 7,525,289 B2 | 4/2009 | Janik et al. | |
| 7,573,381 B2 | 8/2009 | Karr et al. | |
| 7,574,192 B2 | 8/2009 | Gudmundsson | |
| 7,592,918 B2 | 9/2009 | Karr | |
| 7,593,711 B2 | 9/2009 | Romano et al. | |
| 7,598,855 B2 | 10/2009 | Scalisi et al. | |
| 7,733,187 B2 * | 6/2010 | Tateoka | H03F 1/56 330/302 |
| 7,768,234 B2 | 8/2010 | Janik et al. | |
| 7,853,218 B2 | 12/2010 | Romano et al. | |
| 8,013,735 B2 | 9/2011 | Arpin et al. | |
| 8,036,152 B2 | 10/2011 | Hirt et al. | |
| 8,099,062 B1 | 1/2012 | Terrovitis et al. | |
| 8,126,036 B2 | 2/2012 | Koren et al. | |
| 8,150,686 B2 | 4/2012 | Sgraja et al. | |
| 8,223,783 B2 | 7/2012 | Shorty | |
| 8,229,518 B2 | 7/2012 | Bourque | |
| 8,489,271 B2 | 7/2013 | Hergesheimer et al. | |
| 8,618,957 B2 | 12/2013 | Meacci et al. | |
| 8,630,605 B2 | 1/2014 | Meacci et al. | |
| 8,787,823 B2 | 7/2014 | Justice | |
| 9,088,398 B2 | 7/2015 | Rhodes et al. | |
| 9,112,674 B2 | 8/2015 | Meacci et al. | |
| 9,480,037 B2 | 10/2016 | Meacci et al. | |
| 9,565,636 B2 | 2/2017 | Meacci et al. | |
| 2002/0019215 A1 | 2/2002 | Romans | |
| 2003/0030568 A1 | 2/2003 | Lastinger et al. | |
| 2003/0067672 A1 | 4/2003 | Bodeep et al. | |
| 2003/0112124 A1 | 6/2003 | Gudmundsson | |
| 2003/0117969 A1 | 6/2003 | Koo et al. | |
| 2003/0154027 A1 | 8/2003 | Flick et al. | |
| 2003/0218500 A1 * | 11/2003 | Yamamoto | H03F 3/193 330/51 |
| 2004/0017859 A1 | 1/2004 | Sills et al. | |
| 2004/0039504 A1 | 2/2004 | Coffee et al. | |
| 2004/0075494 A1 | 4/2004 | Klomsdorf et al. | |
| 2004/0104771 A1 | 6/2004 | Dauphinee et al. | |
| 2004/0105033 A1 | 6/2004 | Dauphinee et al. | |
| 2004/0130488 A1 | 7/2004 | Champlain | |
| 2004/0201520 A1 | 10/2004 | Flick et al. | |
| 2004/0207468 A1 | 10/2004 | Klomsdorf et al. | |
| 2004/0207510 A1 | 10/2004 | Buchner | |
| 2005/0130617 A1 | 6/2005 | Burns et al. | |
| 2005/0208910 A1 | 9/2005 | Burns et al. | |
| 2005/0233764 A1 | 10/2005 | Solski et al. | |
| 2005/0258806 A1 | 11/2005 | Janik et al. | |
| 2006/0067435 A1 | 3/2006 | Ogawa et al. | |
| 2006/0194549 A1 | 8/2006 | Janik et al. | |
| 2006/0255935 A1 | 11/2006 | Scalisi et al. | |
| 2006/0276160 A1 | 12/2006 | Romano et al. | |
| 2007/0008108 A1 | 1/2007 | Schurig et al. | |
| 2007/0103271 A1 | 5/2007 | King | |
| 2007/0194924 A1 | 8/2007 | Karr | |
| 2007/0207750 A1 | 9/2007 | Brown et al. | |
| 2007/0281626 A1 | 12/2007 | Dobosz et al. | |
| 2008/0144539 A1 | 6/2008 | Sperlich et al. | |
| 2008/0164940 A1 | 7/2008 | Jeon et al. | |
| 2008/0180178 A1 | 7/2008 | Gao et al. | |
| 2008/0240311 A1 | 10/2008 | Piirainen et al. | |
| 2009/0309656 A1 | 12/2009 | Jeon et al. | |
| 2010/0179897 A1 | 7/2010 | Gafford et al. | |
| 2010/0240302 A1 | 9/2010 | Buczkiewicz | |
| 2011/0095915 A1 | 4/2011 | Justice et al. | |
| 2011/0098015 A1 | 4/2011 | Goodwin et al. | |
| 2012/0120990 A1 | 5/2012 | Koren et al. | |
| 2014/0010210 A1 | 1/2014 | Rhodes et al. | |
| 2014/0105089 A1 | 4/2014 | Meacci et al. | |
| 2014/0105341 A1 | 4/2014 | Meacci et al. | |
| 2014/0119567 A1 | 5/2014 | DeLine et al. | |
| 2015/0015424 A1 | 1/2015 | Justice et al. | |
| 2016/0073369 A1 | 3/2016 | Meacci et al. | |
| 2016/0087658 A1 | 3/2016 | Weissman et al. | |
| 2016/0209818 A1 | 7/2016 | Mandle et al. | |
| 2016/0214572 A1 | 7/2016 | Snider | |
| 2016/0241699 A1 | 8/2016 | Milnark et al. | |
| 2017/0127353 A1 | 5/2017 | Meacci et al. | |
| 2018/0138878 A1 | 5/2018 | Domino et al. | |

* cited by examiner

SINGLE STAGE RAMPED POWER AMPLIFIERS

CROSS REFERENCE TO RELATED APPLICATIONS

The present invention claims priority to U.S. Provisional Patent Application 62/529,294, filed Jul. 6, 2017, the disclosure of which is hereby incorporated by reference in its entirety.

FIELD OF THE INVENTION

The present invention relates to power amplifiers and more specifically to RF power amplifiers.

BACKGROUND

An amplifier is a device designed to increase the power of an input signal by controlling the output of the amplifier to match the shape of the input signal. Typically, an amplifier modulates the output of a power supply based on the input signal, thereby outputting a signal that has the same waveform of the input signal but at a higher amplitude. A radio frequency (RF) power amplifier is a type of amplifier that converts a low-power RF signal into a higher power RF signal, typically used to drive an antenna to transmit the higher power RF signal.

SUMMARY OF THE INVENTION

Single stage ramped power amplifiers in accordance with embodiments of the invention are disclosed. In one embodiment, a single stage ramped power amplifier includes a RF transceiver, a ramp voltage, a power supply, and an output circuit, wherein the ramp voltage is coupled to a resistor that is coupled to a first inductor, the power supply is coupled to a second inductor, the RF transceiver is coupled to the second inductor and a first capacitor, the first capacitor is coupled to a PIN diode, the PIN diode is coupled to the first inductor and a second capacitor, the second capacitor is coupled to a first transistor, the first transistor is coupled to a third capacitor, the third capacitor is coupled to a third inductor, the third inductor is coupled to a second transistor, and the second transistor is coupled to the output circuit.

In an additional embodiment of the invention, the single stage ramped power amplifier and the output circuit comprise a Class E amplifier.

In another embodiment of the invention, the RF transceiver is implemented using an integrated narrowband RF transceiver.

In yet another additional embodiment of the invention, the power supply provides 2.5V.

In still another additional embodiment of the invention, the PIN diode is forward biased.

In yet still another additional embodiment of the invention, the PIN diode is reverse biased.

In yet another embodiment of the invention, the PIN diode comprises a package of a plurality of PIN diodes.

In still another embodiment of the invention, the package of PIN diodes comprises four PIN diodes.

In yet still another embodiment of the invention, the second transistor comprises a metal-oxide-semiconductor field-effect transistor.

In yet another additional embodiment of the invention, the RF transceiver provides an RF signal at 173 MHz.

In still another additional embodiment of the invention, the RF transceiver provides an RF signal at a frequency selected from the group consisting of 850 MHz, 900 MHz, 1800 MHz, and 1900 MHz.

In yet still another additional embodiment of the invention, the RF transceiver provides an RF signal at a frequency selected from the group consisting of 700 MHz, 850 MHz, 1700 MHz, 1900 MHz, and 2100 MHz.

In yet another embodiment of the invention, the RF transceiver provides an RF signal at a frequency selected from the group consisting of 700 MHz, 850 MHz, 1700 MHz, 1800 MHz, 1900 MHz, 2100 MHz, 2300 MHz, and 2500 MHz.

In still another embodiment of the invention, the output circuit comprises a matching circuit and a low pass filter.

In yet still another embodiment of the invention, the low pass filter is coupled to an antenna circuit.

In yet another additional embodiment of the invention, the second capacitor is coupled to the third inductor.

Other objects, advantages and novel features, and further scope of applicability of the present invention will be set forth in part in the detailed description to follow, and in part will become apparent to those skilled in the art upon examination of the following, or may be learned by practice of the invention. The objects and advantages of the invention may be realized and attained by means of the instrumentalities and combinations particularly pointed out in the prepended claims.

BRIEF DESCRIPTION OF THE DRAWINGS

The description will be more fully understood with reference to the following figures, which are presented as exemplary embodiments of the invention and should not be construed as a complete recitation of the scope of the invention, wherein.

DETAILED DESCRIPTION

Figure 1A:
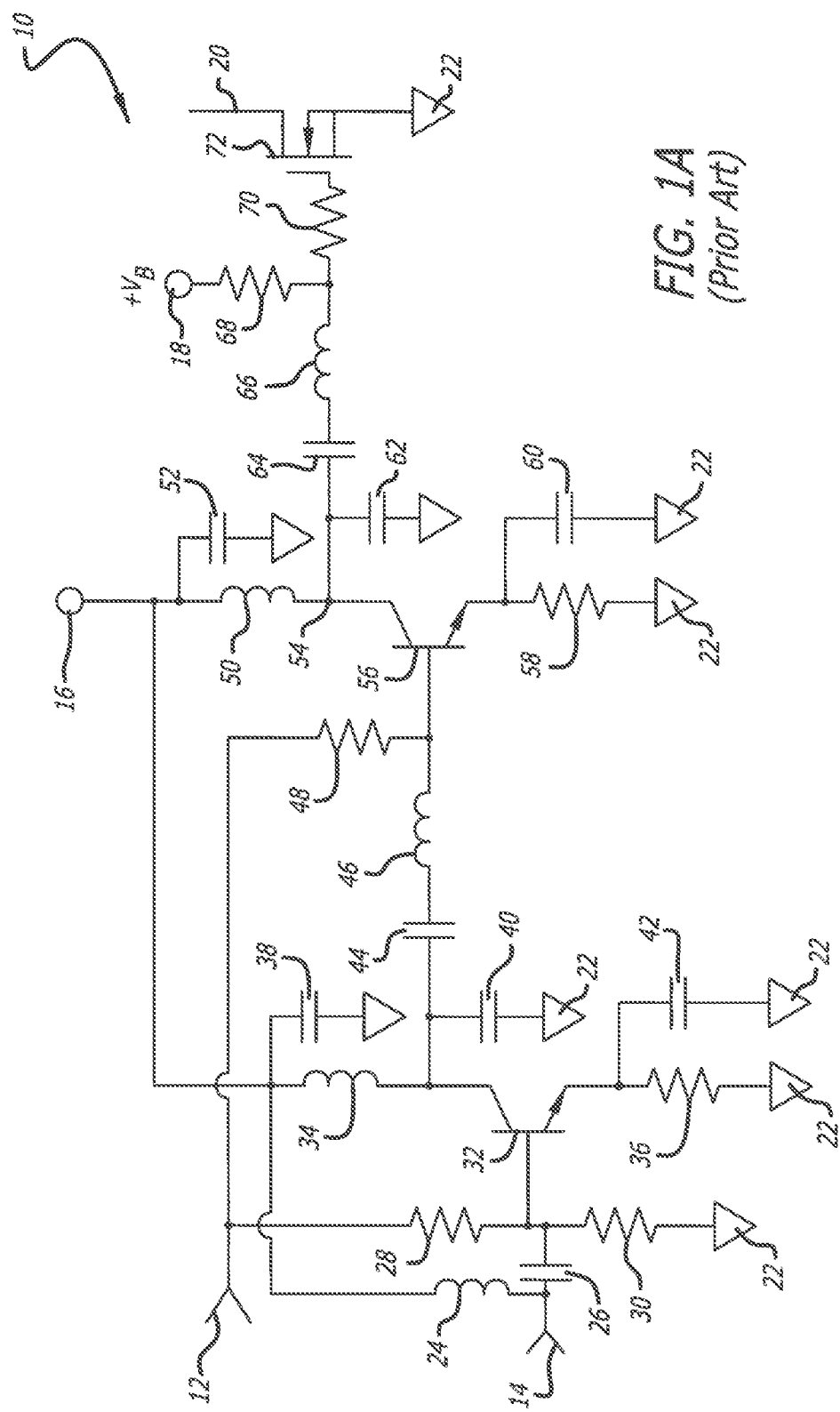
FIG. 1A is a circuit diagram of a prior art power amplifier.

Turning now to the drawings, single stage ramped power amplifiers in accordance with various embodiments of the invention are disclosed. Power amplifiers are commonly utilized to amplify a signal to a desired power for transmission, such as to achieve a desired signal strength and/or transmission range. Power amplifiers, particularly those that amplify low power signals, typically utilize two or more amplification stages to step up the signal power to the desired level because a single stage often does not provide enough gain when ramped fully on and enough isolation when ramped fully off. Power amplifiers can use two amplification stages to get high attenuation (i.e. the reduction of the amplitude of a signal, electric current, or other oscillation) levels in a first stage then achieve the desired amplification level in a second stage. It should be noted that a ramped driver amplifier commonly cannot be incorporated into an integrated circuit because the only way to achieve a ramp in an integrated circuit is using digital steps, and such steps can cause spurious sideband energy that is incompatible with many applications. Additionally, a two-stage design often requires a larger surface area to be mounted, more components, and more current consumed to power each of the amplification stages. Examples of power amplifiers are described in more detail below with respect to FIGS. 1A and 1B.

Single stage ramped (SSR) power amplifiers in accordance with many embodiments of the invention improve on previous power amplifier designs by first amplifying a signal (without the need to ramp) to the maximum level and then applying the amplified signal to an attenuator (which is smoothly ramped), thereby allowing for high drive levels and high isolation to be simultaneously achieved. The topology of SSR power amplifiers in accordance with several embodiments of the invention allows all the amplification circuitry to be included in an integrated circuit and only utilizes one stage of smoothly ramped attenuation external to the integrated circuit. By incorporating more of the circuitry inside of an integrated circuit and less circuitry external to the integrated circuit, SSR power amplifiers can occupy less physical space, utilize fewer components, and be more power efficient relative to prior art power amplifier designs. In several embodiments, a ramp is used to slowly turn on the signal at the start of a transmission and/or also to slowly turn off the signal at the end of the transmission. In a variety of embodiments, this slow turn on and/or off limits the amount of energy present in adjacent bands (i.e. frequencies within a threshold value of the desired frequency of the signal to be transmitted). In many embodiments, SSR power amplifiers are linearly ramped. That is, the ramping is done by an analog voltage (or current) that varies in time. Prior art power amplifiers required two transistor stages in order to provide sufficient ramping dynamic range due to the isolation required for avoiding sideband emissions. SSR power amplifiers in accordance with embodiments of the invention reduce the number of required transistor stages to only one, effectively replacing one of the transistor stages with a PIN diode, thereby reducing size, cost and current consumption.

One application that can benefit from the use of SSR power amplifiers is stolen vehicle recovery systems. Stolen vehicle recovery systems commonly include one or more locating units installed within a vehicle that communicate with a network of communication towers. Systems and methods for stolen vehicle recovery systems that can be utilized in accordance with many embodiments of the invention are described in U.S. Pat. No. 8,013,735, issued Sep. 6, 2011 and U.S. Pat. No. 9,088,398, issued Jul. 21, 2015. In addition to the network of communication towers, vehicle tracking units, stolen vehicle recovery systems can include a network center with a database of customers who have purchased locating units. When the network center is notified that a vehicle has been stolen, the network center causes the communication towers to transmit a message; this message activates the locating unit installed in the vehicle. The activated locating unit broadcasts a signal that can be detected by the vehicle tracking units that can then locate the vehicle and effect its recovery. Systems and methods for synchronizing communications in a stolen vehicle recovery system that can be used in accordance with embodiments of the invention are disclosed in U.S. Pat. No. 8,630,605, issued Jan. 14, 2014. In many vehicle recovery systems, the locating units installed in vehicles that have not been stolen can, on receiving a signal that a vehicle has been stolen, repeat the signal broadcasted by the communication towers. This repeating action can be utilized to increase the coverage area of the vehicle locating system. Systems and methods for stolen vehicle recovery systems that can be utilized in accordance with embodiments of the invention are described in U.S. Pat. No. 8,787,823, issued Jul. 22, 2014. The disclosures of U.S. Pat. Nos. 8,013,735, 8,630,605, 8,787,823, and 9,088,398 are hereby incorporated by reference in their entirety.

It should be noted that, throughout the specification, power amplifiers and SSR power amplifiers are commonly referenced with respect to particular currents and/or signals for clarity in description. However, a reference to a signal and/or current includes a current and/or signal input and/or via which a current and/or signal can be received and/or transmitted as appropriate to the requirements of specific applications of embodiments of the invention.

(Prior Art) Power Amplifiers

As described above, many prior art power amplifiers utilize multiple stages to amplify a signal prior to transmission. Turning now to FIG. 1A, a prior art power amplifier is shown. The power amplifier 10 includes a ramp voltage 12, an input signal 14, a power supply 16, a bias voltage 18, an output circuit 20, and ground 22. Input signal 14 is coupled to an inductor 24 and a capacitor 26. Inductor 24 is coupled to capacitor 38 that is coupled to ground 22. Capacitor 26 is coupled to resistor 28, resistor 30 (which is coupled to ground 22), and transistor 32. Transistor 32 is coupled to resistor 36, capacitor 40, and capacitor 42, all of which are coupled to ground 22. Transistor 32 is further coupled to capacitor 44, which is coupled to inductor 46, which is coupled to resistor 48 and transistor 56. Ramp voltage 12 is coupled to resister 28 and resistor 48. Power supply 16 is coupled to inductor 34, capacitor 52 (which is coupled to ground 22), and inductor 50 which is coupled to transistor 56. Transistor 56 is further coupled to resistor 58 and capacitor 60, both of which are coupled to ground 22. Transistor 56 and inductor 50 are coupled at junction 54, which is coupled to capacitor 62 (which is coupled to ground 22) and capacitor 64, which is coupled to inductor 66. Inductor 66 is coupled to resistor 68, which is coupled to bias voltage 18, and resistor 70 which is coupled to metal-oxide-semiconductor field-effect transistor 72, which is coupled to output circuit 20 and ground 22.

Figure 1B:
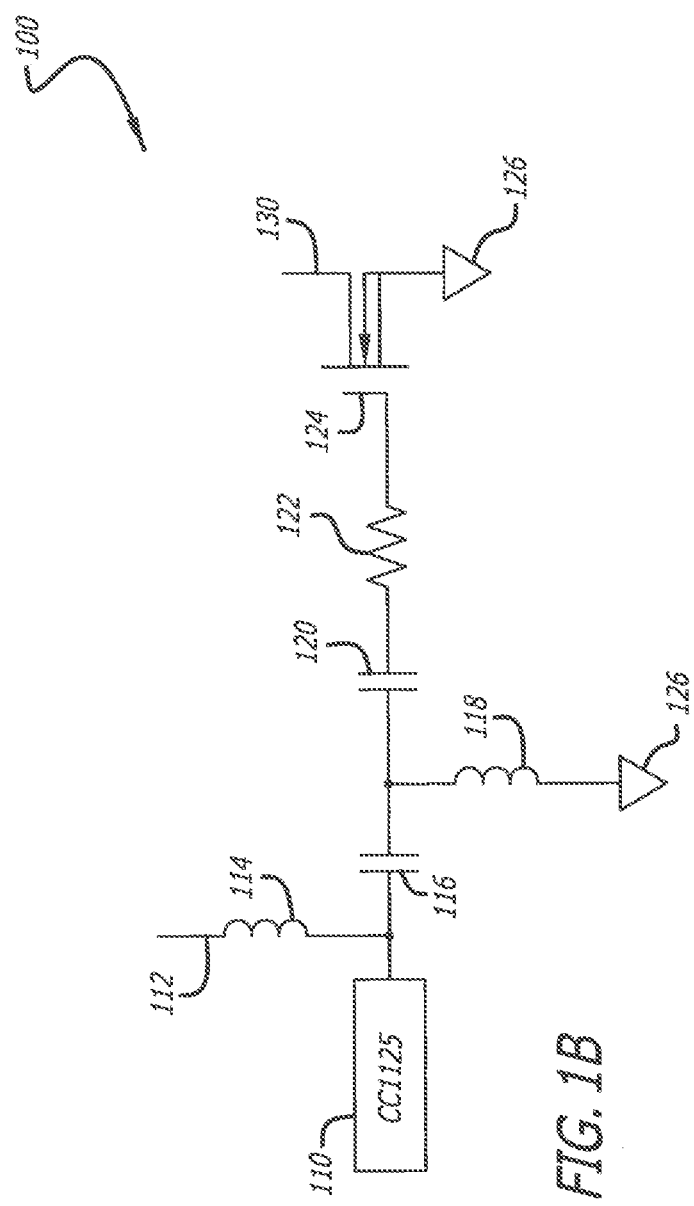
FIG. 1B is a circuit diagram of a digitally ramped power amplifier in an integrated circuit.

Turning now to FIG. 1B, a digitally ramped power amplifier in an integrated circuit is shown. The power amplifier 100 includes a CC1125 RF transceiver 110, a power supply 112, and an output circuit 130. Transceiver 110 is coupled to inductor 114 (which is coupled to power supply 112) and capacitor 116, which is coupled to inductor 118 (which is coupled to ground 126) and capacitor 120. Capacitor 120 is coupled to resistor 122, which is coupled to metal-oxide-semiconductor field-effect transistor 124, which is coupled to output circuit 130 and ground 126. In the power amplifier 100, the signal emitted from the RF transceiver 110 is digitally ramped. However, the power amplifier 100 is not capable of digitally ramping the signal with a small enough step size to avoid the generation of significant transient energy. This generated transient energy leads to excessive sideband (or other unwanted) emissions, thereby rendering the power amplifier 100 unsuitable for use in accordance with the requirements of embodiments of the invention.

Although specific embodiments of power amplifiers are described above with respect to FIGS. 1A and 1B, it should be noted that a variety of other prior art power amplifiers can utilize multiple amplification stages and be improved on in accordance with embodiments of the invention. SSR power amplifiers in accordance with embodiments of the invention are described in more detail below.

Single Stage Ramped Power Amplifiers

SSR power amplifiers in accordance with several embodiments of the invention can utilize PIN diodes to implement a single amplification stage for the output of a RF transceiver, thereby amplifying the output signal to a power level suitable for transmission. In several embodiments, the RF transceiver can be implemented using a CC1125 RF Narrowband Transceiver manufactured by Texas Instruments of Dallas, TX. The CC1125 is a fully integrated single-chip radio transceiver for low power RF transmissions at frequency bands at 164-192 MHz, 274-320 MHz, 410-480 MHz, and 820-960 MHz. However, SSR power amplifiers can amplify signals at any of a variety of desired frequencies, including frequency band(s) that contain one or more of the following frequencies 173 MHz, 700 MHz, 800 MHz, 850 MHz, 900 MHz, 1176 MHz, 1227 MHz, 1500 MHz, 1575 MHz, 1700 MHz, 1800 MHz, 1900 MHz, 2100 MHz, 2300 MHz, 2441 MHz, 2500 MHz, 2600 MHz, 5437 MHz, or any other frequency band(s) as appropriate to the requirements of specific applications of embodiments of the invention. SSR power amplifiers commonly operate off a 2.5V DC power supply, although SSR power amplifiers can operate on any voltage, such as 1.5V, 3.3V, 5V, and 12V, as appropriate to the requirements of specific applications of embodiments of the invention.

Figure 2:
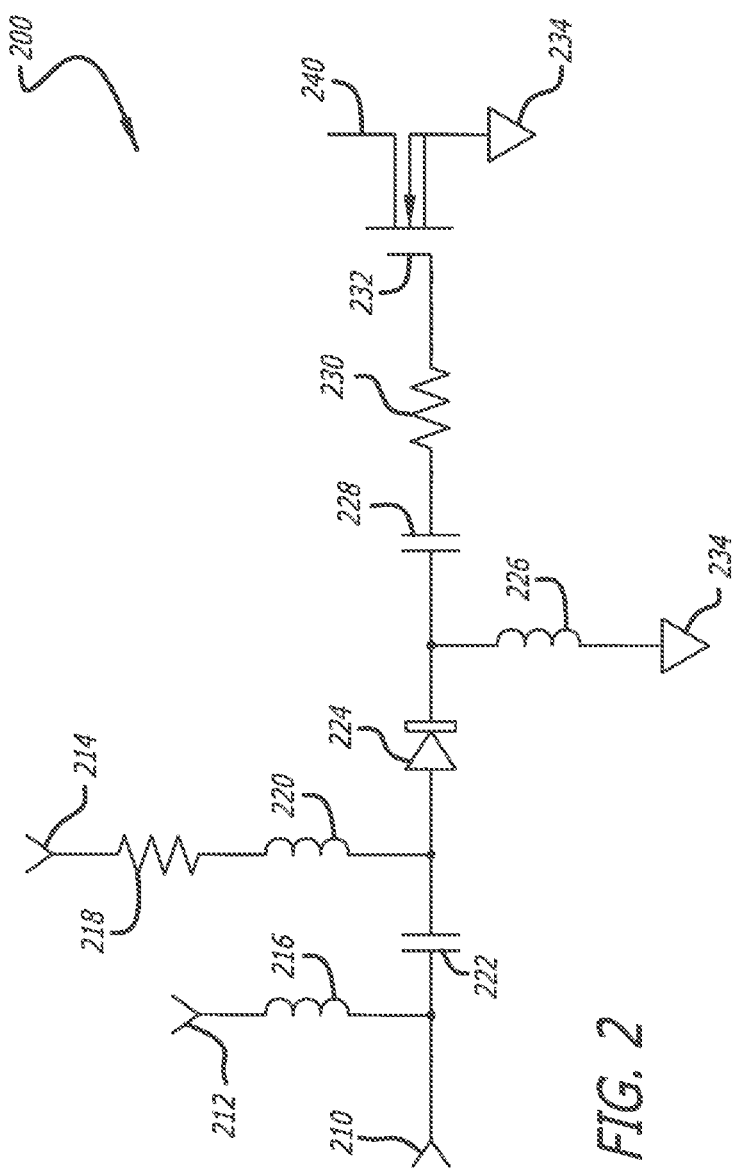
FIGS. 2-6 are circuit diagrams of single stage ramped power amplifiers in accordance with embodiments of the invention.

Turning now to FIG. 2, a SSR power amplifier circuit diagram in accordance with an embodiment of the invention is shown. SSR power amplifier 200 includes a RF transceiver 210, a power supply 212, a ramp voltage 214, and an output circuit 240. RF transceiver 210 is coupled to inductor 216 (which is coupled to power supply 212) and capacitor 222. Capacitor 222 is coupled to inductor 220, which is coupled to resistor 218 that is coupled to ramp voltage 214. In many embodiments, resistor 218 converts the ramp voltage 214 to a ramp current for operating PIN diode 224. Inductor 220 and capacitor 222 are coupled to PIN diode 224, which is coupled to inductor 226 (which is coupled to ground 234) and capacitor 228. Capacitor 228 is coupled to resistor 230, which is coupled to transistor 232. In the illustrated embodiment, transistor 232 is a metal-oxide-semiconductor field-effect transistor, although any of a variety of transistors can be utilized as appropriate to the requirements of specific applications of embodiments of the invention. Transistor 232 is coupled to output circuit 240 and ground 234. In a variety of embodiments, the portion of SSR power amplifier 200 between capacitor 222 and resistor 230 is considered a single ramped stage without a transistor, the portion of the circuit including resistor 230 is an output circuit, and the portion of the circuit including capacitor 222 is an input circuit. In this way, the single ramped stage can be utilized with input circuits and/or output circuits other than those illustrated in FIG. 2 in accordance with embodiments of the invention.

Figure 3:
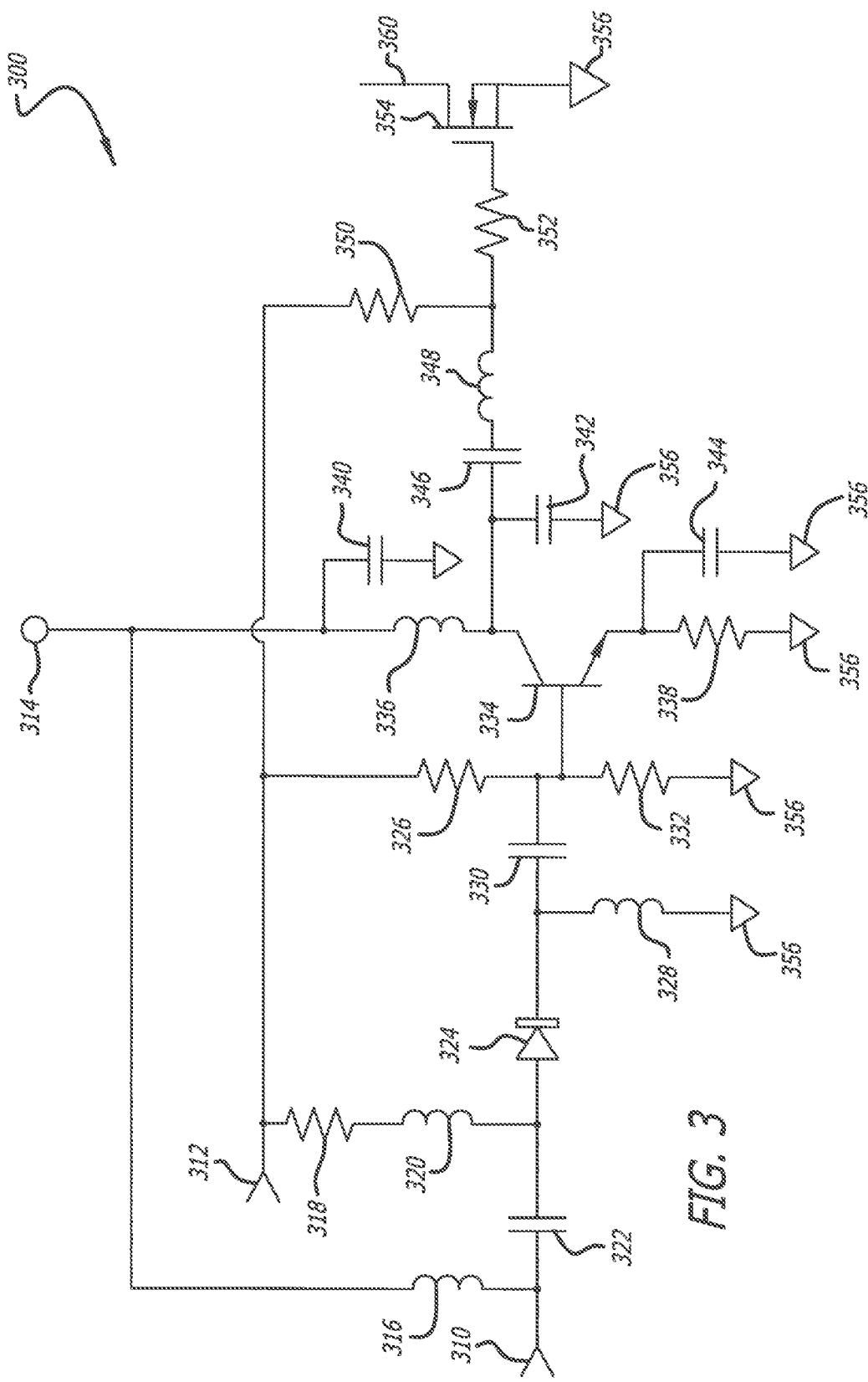

Turning now to FIG. 3, a second SSR power amplifier circuit diagram in accordance with an embodiment of the invention is shown. SSR power amplifier 300 includes a RF transceiver 310, a ramp voltage 312, power supply 314, and output circuit 360. Ramp voltage 312 is coupled to resistor 318 (which is coupled to inductor 320), resistor 326, and resistor 350. In many embodiments, resistor 318 converts the ramp voltage 312 to a ramp current for operating PIN diode 324. Power supply 314 is coupled to inductor 316 and inductor 336, along with capacitor 340 that is coupled to ground 356. RF transceiver 310 is coupled to inductor 316, both of which are coupled to capacitor 322. Capacitor 322 and inductor 320 are coupled to PIN diode 324, which is coupled to inductor 328 (which is coupled to ground 356) and capacitor 330. Capacitor 330 is coupled to resistor 326, transistor 334, and resistor 332, which is coupled to ground 356. Transistor 334 is coupled to inductor 336, resistor 338, and capacitor 344, the latter two being coupled to ground 356. Transistor 334 and inductor 336 are coupled to capacitor 342 (coupled to ground 356) and capacitor 346, which is coupled to inductor 348. Inductor 348 and resistor 350 are coupled to resistor 352, which is coupled to transistor 354. Transistor 354 is coupled to output circuit 360 and ground 356. In a number of embodiments, the portion of SSR power amplifier 300 between capacitor 322 and resistors 350 and 352 is considered a single ramped transistor stage, the portion of the circuit including resistors 350 and 352 is an output circuit, and the portion of the circuit including capacitor 322 is an input circuit. In this way, the single ramped stage can be utilized with input circuits and/or output circuits other than those illustrated in FIG. 3 in accordance with embodiments of the invention.

Figure 4:
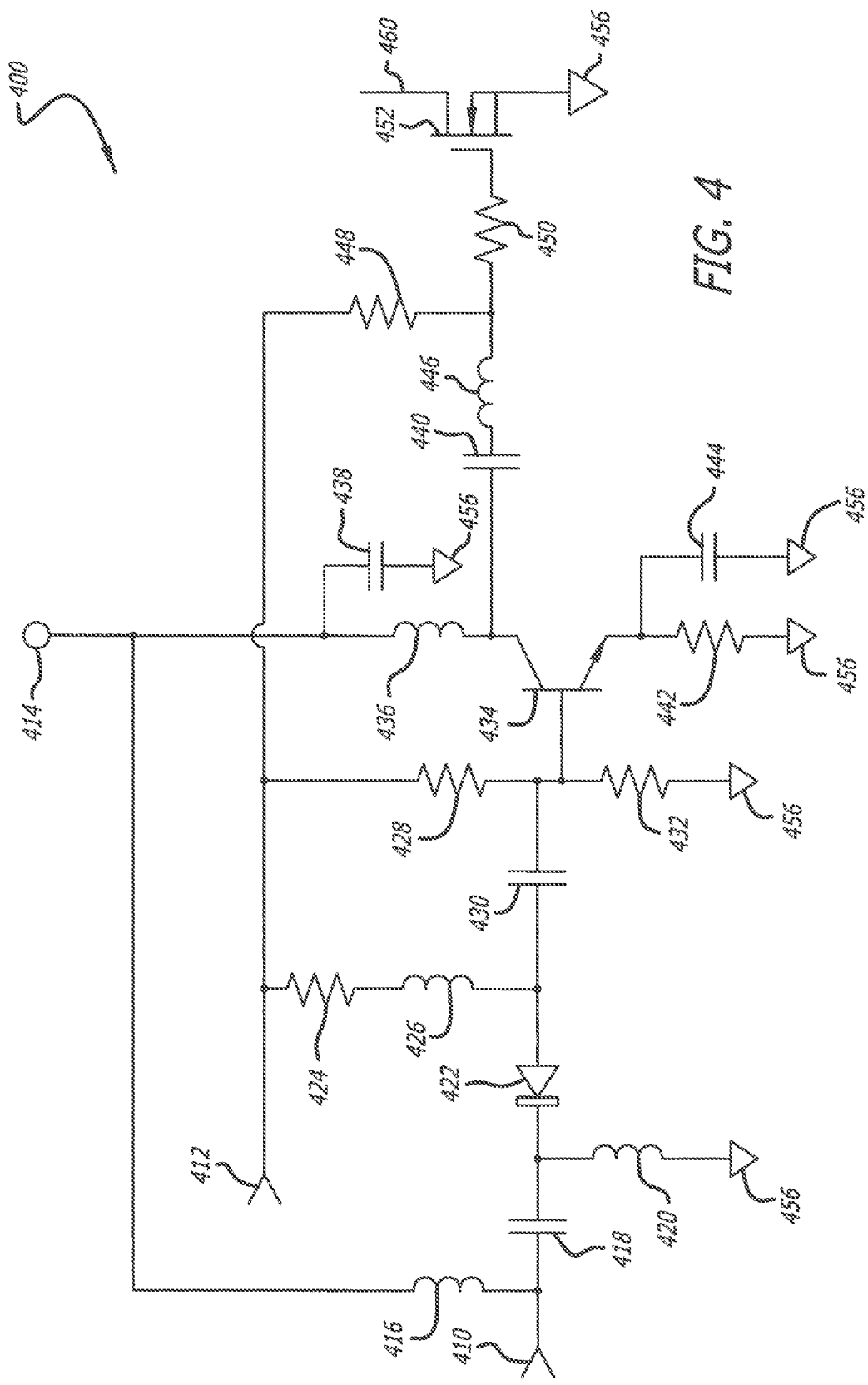

Turning now to FIG. 4, a third SSR power amplifier circuit diagram in accordance with an embodiment of the invention is shown. SSR power amplifier 400 includes a RF transceiver 410, a ramp voltage 412, power supply 414, and output circuit 460. Ramp voltage 412 is coupled to resistor 424 (which is coupled to inductor 426), resistor 428, and resistor 448. In many embodiments, resistor 424 converts the ramp voltage 412 to a ramp current for operating PIN diode 422. Power supply 414 is coupled to inductor 416, inductor 436, and capacitor 438 that is coupled to ground 456. RF transceiver 410 is coupled to inductor 416, both of which are coupled to capacitor 418. Capacitor 418 and inductor 420 (which is coupled to ground 456) are coupled to PIN diode 422, which is coupled to inductor 426 and capacitor 430. Capacitor 430 is coupled to resistor 428, transistor 434, and resistor 432, which is coupled to ground 456. Transistor 434 is coupled to inductor 436, resistor 442, and capacitor 444, the latter two being coupled to ground 456. Transistor 434 and inductor 436 are coupled to capacitor 440, which is coupled to inductor 446. Inductor 446 and resistor 448 are coupled to resistor 450, which is coupled to transistor 452. Transistor 452 is coupled to output circuit 460 and ground 456. In several embodiments, the portion of SSR power amplifier 400 between capacitor 418 and resistors 448 and 450 is considered a single ramped transistor stage, the portion of the circuit including resistors 448 and 450 is an output circuit, and the portion of the circuit including capacitor 418 is an input circuit. In this way, the single ramped stage can be utilized with input circuits and/or output circuits other than those illustrated in FIG. 4 in accordance with embodiments of the invention.

In comparing SSR power amplifier 300 to SSR power amplifier 400, the direction of the PIN diode is reversed. In a variety of embodiments, the PIN diodes are forward biased, although reverse biased PIN diodes can be utilized as appropriate to the requirements of specific applications of embodiments of the invention. In many embodiments, the PIN diode introduces a voltage drop of 0.7V or 0.3V, although any voltage drop can be introduced as appropriate to the requirements of specific applications of embodiments of the invention.

Figure 5:
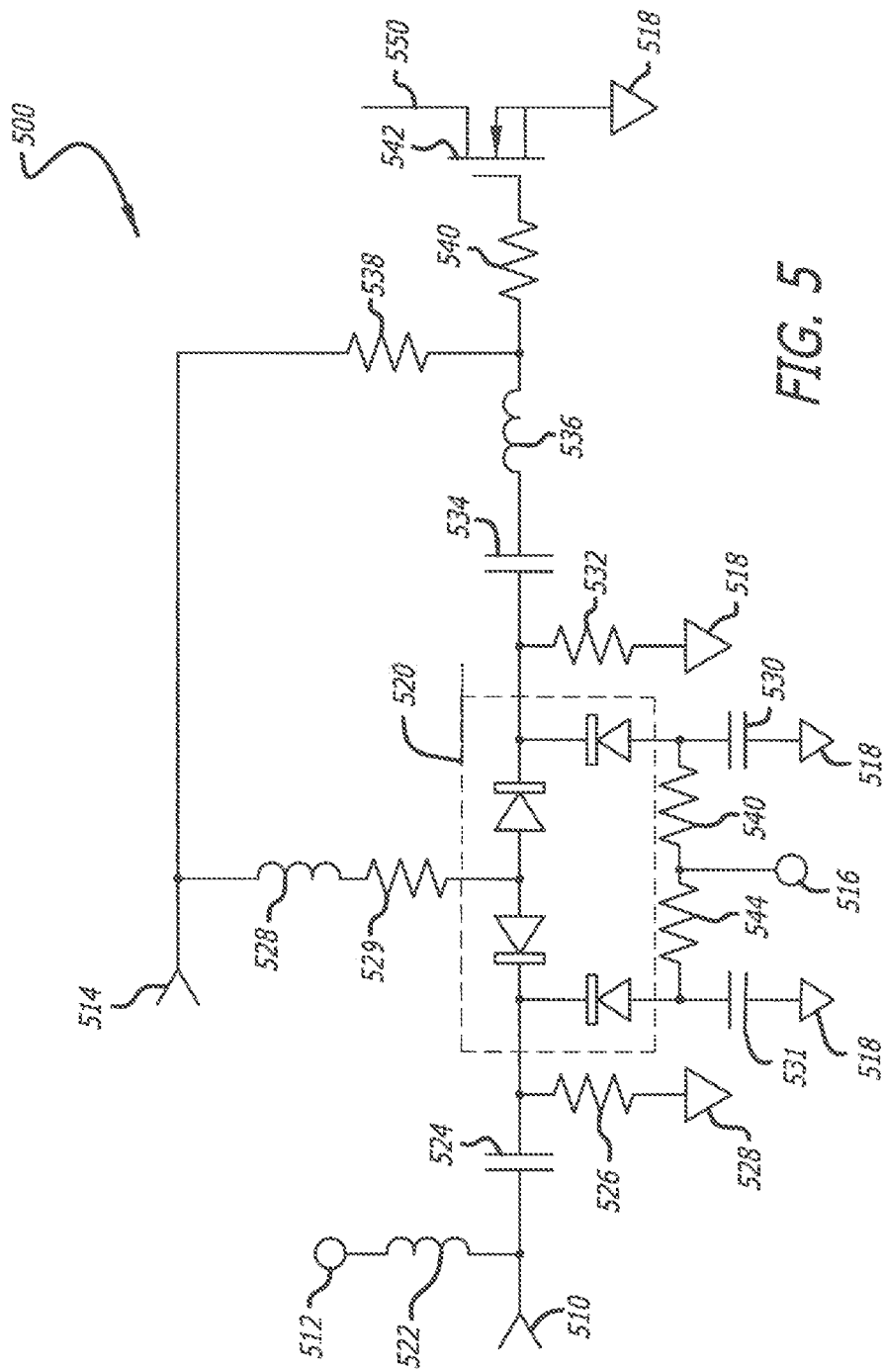

In many embodiments, SSR power amplifiers need to provide more attenuation than a single PIN diode can provide. In these SSR power amplifiers, a package of PIN diodes can be utilized to increase the signal attenuation. Turning now to FIG. 5, a circuit diagram of a SSR power amplifier having a package of PIN diodes is shown. The SSR power amplifier 500 includes a RF transceiver 510, a power supply 512, a ramp voltage 514, bias voltage source 516, and an output circuit 550. Ramp voltage 514 is coupled to inductor 528 (which is coupled to resistor 529) and resistor 538. Power supply 512 is coupled to inductor 522. RF transceiver 510 is coupled to inductor 522, both of which are coupled to capacitor 524. Capacitor 524 is coupled to resistor 526 (which is coupled to ground 528) and PIN diode package 520. In the illustrated embodiment, PIN diode package 520 includes four PIN diodes, although any number of diodes can be included in PIN diode package 520 in any orientation as appropriate to the requirements of specific applications of embodiments of the invention. In many embodiments, resistors 526, 529, 532, 540, and 544 converts the ramp voltage 514 to a ramp current for operating the PIN diode package 520. Bias voltage source 516 is coupled to resistor 544 and resistor 540, which are coupled to capacitor 531 and capacitor 530 respectively, both of which are coupled to ground 518. Resistor 544, resistor 540, capacitor 531, and capacitor 530 are coupled to PIN diode package 520. Pin diode package 520 is further coupled to resistor 529, resistor 532 (which is coupled to ground 518), and capacitor 534. Capacitor 534 is coupled to inductor 536; inductor 536 and resistor 538 are coupled to resistor 540 that is coupled to transistor 542. Transistor 542 is coupled to output circuit 550 and ground 518. In many embodiments, the portion of SSR power amplifier 500 between capacitor 524 and resistors 538 and 540 is considered a single ramped stage without a transistor, the portion of the circuit including resistors 538 and 540 is an output circuit, and the portion of the circuit including capacitor 524 is an input circuit. In this way, the single ramped stage can be utilized with input circuits and/or output circuits other than those illustrated in FIG. 5 in accordance with embodiments of the invention.

Figure 6:
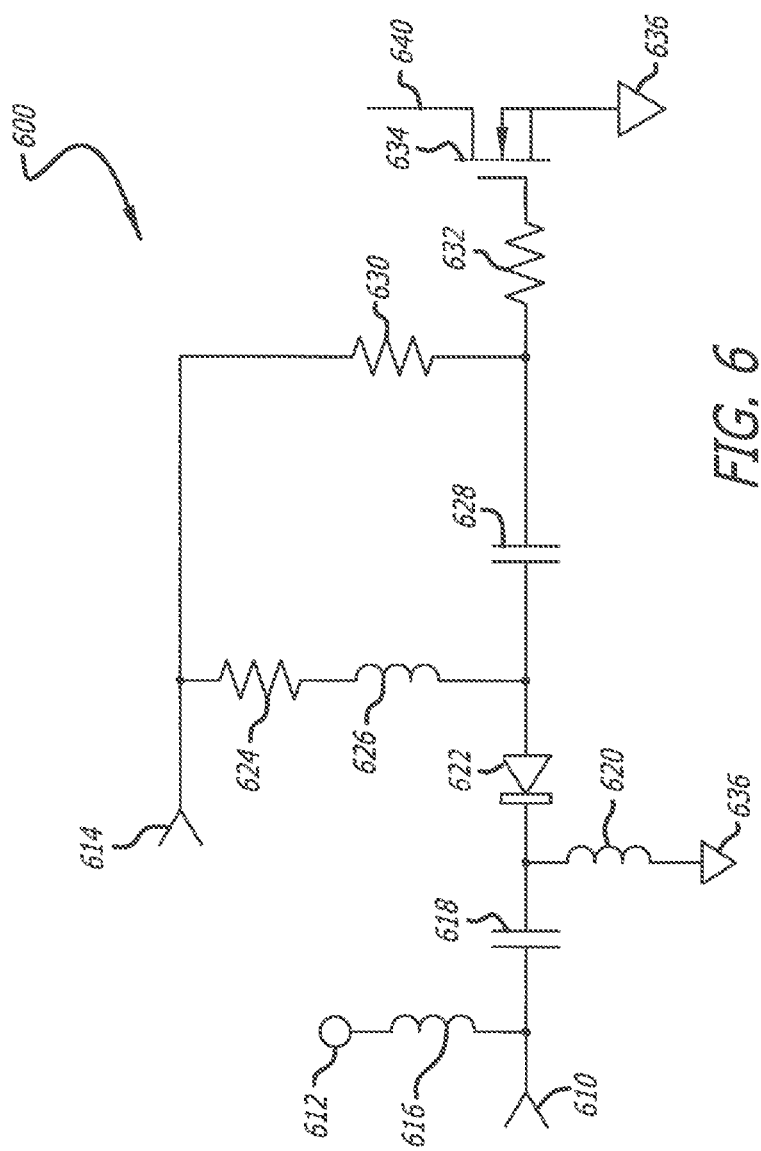

In many embodiments, SSR power amplifiers are utilized in applications involving a variety of power output levels. In those embodiments where a lower power output is acceptable (such as in motorcycle products where there is less metallic structure to interfere with the transmission of RF signals as compared to an automotive product, a SSR power amplifier that utilizes a single PIN diode for attenuation of a single transistor is utilized. Turning now to FIG. 6, a circuit diagram for a low power SSR power amplifier is shown. The SSR power amplifier 600 includes a RF transceiver 610, a power supply 612, a ramp voltage 614, and an output circuit 640. Power supply 612 is coupled to inductor 616. Ramp voltage 614 is coupled to resistor 624 (which is coupled to inductor 626) and resistor 630. In many embodiments, resistor 624 converts the ramp voltage 614 to a ramp current for operating PIN diode 622. RF transceiver 610 is coupled to inductor 616 and capacitor 618. Capacitor 618 is coupled to inductor 620 (which is coupled to ground 636) and PIN diode 622. Pin diode 622 is coupled to inductor 626 and capacitor 628, which is coupled to resistor 630 and resistor 632. Resistor 632 is coupled to transistor 634, which is coupled to output circuit 640 and ground 636. In a variety of embodiments, the portion of SSR power amplifier 600 between capacitor 618 and resistors 630 and 632 is considered a single ramped stage without a transistor, the portion of the circuit including resistors 630 and 632 is an output circuit, and the portion of the circuit including capacitor 618 is an input circuit. In this way, the single ramped stage can be utilized with input circuits and/or output circuits other than those illustrated in FIG. 6 in accordance with embodiments of the invention.

Although specific embodiments of a SSR power amplifiers are described above with respect to FIGS. 2-6, it should be noted that a variety of other embodiments, including those that utilize PIN diodes in orientations other than those shown and those that utilize transistors other than those illustrated, can be utilized in accordance with embodiments of the invention. Additional details regarding RF transceivers and output circuits in accordance with embodiments of the invention are described in more detail below.

RF Transceivers

Figure 7:
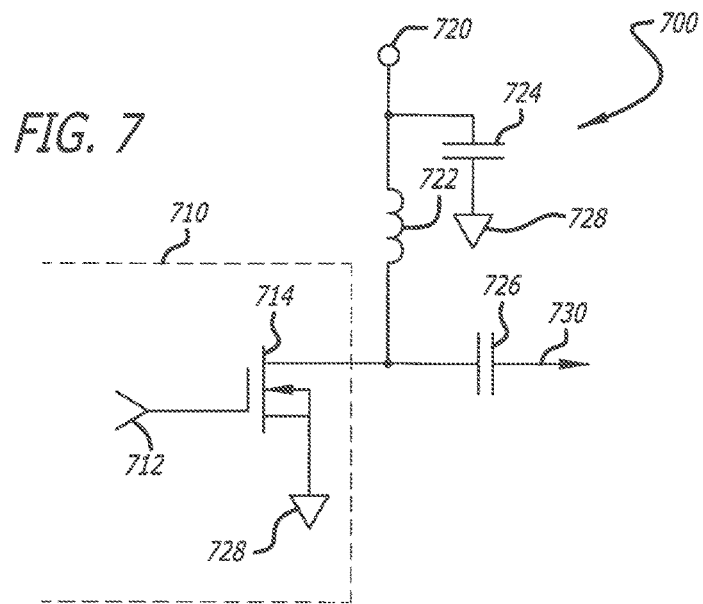
FIG. 7 is a circuit diagram of an input circuit into a single stage ramped power amplifier in accordance with an embodiment of the invention.

SSR power amplifiers in accordance with embodiments of the invention include a RF transceiver input that receives a RF signal from a RF transmitter (or transceiver) or any other input circuit. Turning now to FIG. 7, a circuit diagram of a RF transceiver in accordance with an embodiment of the invention is shown. The RF transceiver 700 includes an integrated RF transceiver chip 710, a power supply 720, and an output port 730. Integrated RF transceiver chip 710 includes a synthesizer input 712 coupled to transistor 714, which is coupled to inductor 722, capacitor 726, and ground 728. As described above, integrated RF transceiver chip 710 can be a CC1125 RF transceiver, although any RF transmitter or transceiver can be utilized in accordance with the requirements of specific applications of embodiments of the invention. Power supply 720 is coupled to capacitor 724 (which is coupled to ground 728) and inductor 722. Inductor 722 is further coupled to capacitor 726, which is coupled to output port 730.

Although a specific embodiment of an input circuit including a RF transceiver is described above with respect to FIG. 7, it should be noted that a variety of other embodiments, including those where all components are integrated using a single circuit, a single chip, and/or a single integrated circuit package, can be utilized in accordance with embodiments of the invention.

Output Circuits

Figure 8:
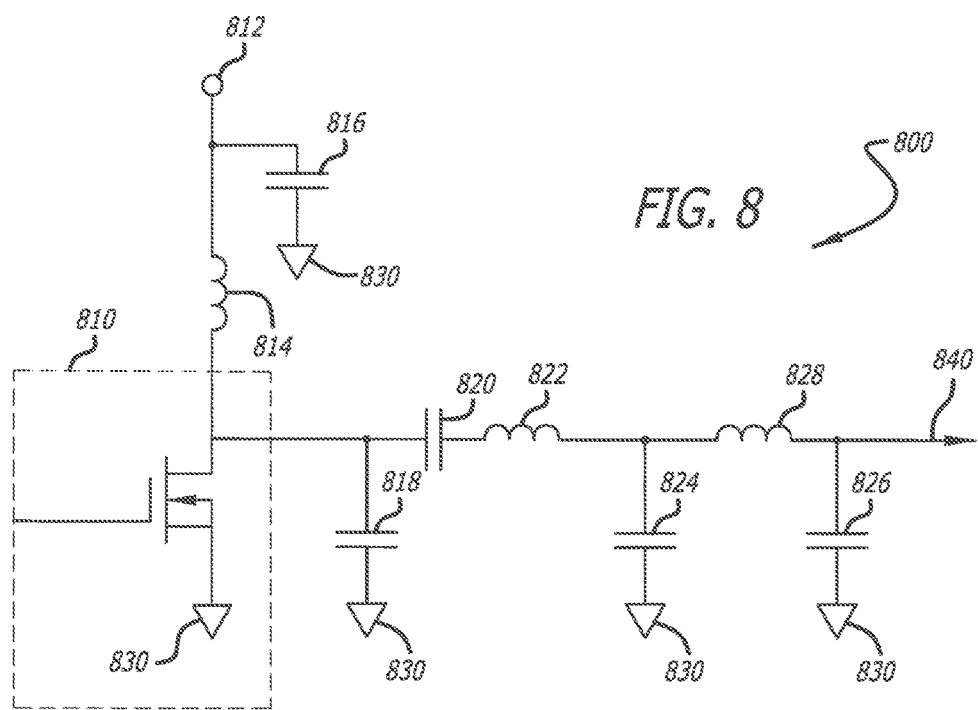
FIG. 8 is a circuit diagram of an output circuit from a single stage ramped power amplifier in accordance with an embodiment of the invention.

Many SSR power amplifiers operate as a Class E switching power amplifier, although a variety of SSR power amplifiers can operate as Class D or Class F amplifiers as appropriate to the requirements of specific applications of embodiments of the invention. Turning now to FIG. 8, a circuit diagram of an output circuit in accordance with an embodiment of the invention is shown. The output circuit 800 includes a SSR power amplifier output 810, a power supply 812, and an RF output 840. Power supply 812 is coupled to capacitor 816 (which is coupled to ground 830) and inductor 814. Power amplifier output 810 is coupled to inductor 814, capacitor 818 (which is coupled to ground 830), and capacitor 820. Capacitor 820 is coupled to inductor 822, which is coupled to capacitor 824 (which is coupled to ground 830) and inductor 828. Inductor 828 is coupled to capacitor 826 (which is coupled to ground 830) and RF output 840. In a variety of embodiments, the RF output 840 is coupled to an antenna or an antenna circuit. In several embodiments, the RF output 840 is coupled to an antenna or antenna circuit using a connector, such as a Bayonet Neill-Concelman (BNC) connector or a Threaded Neill-Concelman (TNC) connector, although any connector can be utilized to electrically couple the output circuit to an antenna or antenna circuit in accordance with embodiments of the invention. In several embodiments, capacitor 818, capacitor 820, and inductor 822 constitute a Class E matching circuit. In a number of embodiments, capacitor 824, capacitor 826, and inductor 828 constitute a low pass filter.

Although a specific embodiment of an output circuit is described above with respect to FIG. 8, it should be noted that a variety of other embodiments, including those utilizing matching circuits and/or low pass filters other than those illustration, can be utilized in accordance with embodiments of the invention.

Although the present invention has been described in certain specific aspects, many additional modifications and variations would be apparent to those skilled in the art. In particular, any of the various processes described above can be performed in alternative sequences and/or in parallel in order to achieve similar results in a manner that is more appropriate to the requirements of a specific application. It is therefore to be understood that the present invention can be practiced otherwise than specifically described without departing from the scope and spirit of the present invention. Thus, embodiments of the present invention should be considered in all respects as illustrative and not restrictive. It will be evident to the person skilled in the art to freely combine several or all of the embodiments discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly required. Accordingly, the scope of the invention should be determined not by the embodiments illustrated, but by the appended claims and their equivalents.

What is claimed is:

1. A single stage ramped power amplifier, comprising:
a RF transceiver;
a ramp voltage;
a power supply; and
an output circuit;
wherein:
the ramp voltage is coupled to a resistor that is coupled to a first inductor;
the power supply is coupled to a second inductor;
the RF transceiver is coupled to the second inductor and a first capacitor;
the first capacitor is coupled to a PIN diode;
the PIN diode is coupled to the first inductor and a second capacitor;
the second capacitor is coupled to a first transistor;
the first transistor is coupled to a third capacitor;
the third capacitor is coupled to a third inductor;
the third inductor is coupled to a second transistor; and
the second transistor is coupled to the output circuit.

2. The single stage ramped power amplifier of claim 1, wherein the single stage ramped power amplifier and the output circuit comprise a Class E amplifier.

3. The single stage ramped power amplifier of claim 1, wherein the RF transceiver is implemented using an integrated narrowband RF transceiver.

4. The single stage ramped power amplifier of claim 1, wherein the power supply provides 2.5V.

5. The single stage ramped power amplifier of claim 1, wherein the PIN diode is forward biased.

6. The single stage ramped power amplifier of claim 1, wherein the PIN diode is reverse biased.

7. The single stage ramped power amplifier of claim 1, wherein the PIN diode comprises a package of a plurality of PIN diodes.

8. The single stage ramped power amplifier of claim 7, wherein the package of PIN diodes comprises four PIN diodes.

9. The single stage ramped power amplifier of claim 1, wherein the second transistor comprises a metal-oxide-semiconductor field-effect transistor.

10. The single stage ramped power amplifier of claim 1, wherein the RF transceiver provides an RF signal at 173 MHz.

11. The single stage ramped power amplifier of claim 1, wherein the RF transceiver provides an RF signal at a frequency selected from the group consisting of 850 MHz, 900 MHz, 1800 MHz, and 1900 MHz.

12. The single stage ramped power amplifier of claim 1, wherein the RF transceiver provides an RF signal at a frequency selected from the group consisting of 700 MHz, 850 MHz, 1700 MHz, 1900 MHz, and 2100 MHz.

13. The single stage ramped power amplifier of claim 1, wherein the RF transceiver provides an RF signal at a frequency selected from the group consisting of 700 MHz, 850 MHz, 1700 MHz, 1800 MHz, 1900 MHz, 2100 MHz, 2300 MHz, and 2500 MHz.

14. The single stage ramped power amplifier of claim 1, wherein the output circuit comprises a matching circuit and a low pass filter.

15. The single stage ramped power amplifier of claim 14, wherein the low pass filter is coupled to an antenna circuit.

16. The single stage ramped power amplifier of claim 1, wherein the second capacitor is coupled to a fourth inductor.

* * * * *